(12) United States Patent
Kim et al.

(10) Patent No.: US 9,847,055 B2
(45) Date of Patent: Dec. 19, 2017

(54) ORGANIC LIGHT EMITTING DISPLAY APPARATUS

(71) Applicant: SAMSUNG DISPLAY CO., LTD., Yongin, Gyeonggi-Do (KR)

(72) Inventors: Yeonhong Kim, Yongin (KR); Moosoon Ko, Yongin (KR); Kwangsuk Kim, Yongin (KR); Choongyoul Im, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 25 days.

(21) Appl. No.: 14/600,075

(22) Filed: Jan. 20, 2015

(65) Prior Publication Data

US 2016/0035805 A1    Feb. 4, 2016

(30) Foreign Application Priority Data

Aug. 4, 2014    (KR) .................. 10-2014-0099974

(51) Int. Cl.
| | |
|---|---|
| *G09G 3/32* | (2016.01) |
| *G09G 3/3225* | (2016.01) |
| *H01L 27/32* | (2006.01) |
| *H01L 51/52* | (2006.01) |
| *G09G 3/3233* | (2016.01) |

(52) U.S. Cl.
CPC ....... *G09G 3/3225* (2013.01); *H01L 27/3262* (2013.01); *H01L 27/3276* (2013.01); *H01L 51/5209* (2013.01); *G09G 3/3233* (2013.01); *G09G 2300/0819* (2013.01); *G09G 2300/0842* (2013.01); *G09G 2300/0861* (2013.01); *G09G 2310/0262* (2013.01); *H01L 27/3211* (2013.01); *H01L 27/3265* (2013.01)

(58) Field of Classification Search
CPC ............... G09G 3/3225; G09G 3/3233; G09G 2300/0819; G09G 2300/0842; G09G 2300/0861; G09G 2310/0262; H01L 27/3262; H01L 27/3276; H01L 27/3211; H01L 27/3265; H01L 51/5209
USPC .................................. 345/76–83; 315/169.3
See application file for complete search history.

(56) References Cited

U.S. PATENT DOCUMENTS 7,365,722 B2 *   4/2008   Lee ...................... G09G 3/3607
                                                        345/690
2003/0067433 A1   4/2003   Nah et al.
(Continued)

FOREIGN PATENT DOCUMENTS

| KR | 2003/0028109 A | 4/2003 |
| KR | 10-2004-0084443 A | 10/2004 |
(Continued)

*Primary Examiner* — Stephen Sherman
(74) *Attorney, Agent, or Firm* — Lee & Morse, P.C.

(57) ABSTRACT

An organic light emitting display apparatus includes a first pixel and a second pixel. The first pixel includes a first data line, a first driving thin film transistor (TFT), and a first contact metal connected to the first driving TFT and in a layer at a same level as a layer of the first data line. The second pixel includes a second data line, a second driving TFT, and a second contact metal connected to the second driving TFT and in a layer at a same level as a layer of the second data line. The first gap between the first driving TFT and the first contact metal is different from a second gap between the second driving TFT and the second contact metal.

15 Claims, 5 Drawing Sheets

(56) References Cited

U.S. PATENT DOCUMENTS

| | | | |
|---|---|---|---|
| 2003/0132927 A1* | 7/2003 | Ouchi | H01L 27/3248 345/204 |
| 2003/0137255 A1* | 7/2003 | Park | G09G 3/3233 315/169.3 |
| 2004/0251819 A1* | 12/2004 | Hsueh | H01L 27/3211 313/506 |
| 2004/0252249 A1 | 12/2004 | Hong | |
| 2008/0055210 A1* | 3/2008 | Cok | G09G 3/006 345/77 |
| 2014/0034923 A1 | 2/2014 | Kim et al. | |
| 2014/0071030 A1 | 3/2014 | Lee | |

FOREIGN PATENT DOCUMENTS

| | | |
|---|---|---|
| KR | 10-2008-0041805 A | 5/2008 |
| KR | 10-2014-0018623 A | 2/2014 |

* cited by examiner

ORGANIC LIGHT EMITTING DISPLAY APPARATUS

CROSS-REFERENCE TO RELATED APPLICATION

Korean Patent Application No. 10-2014-0099974, filed on Aug. 4, 2014, and entitled, "Organic Light Emitting Display Apparatus," is incorporated by reference herein in its entirety.

BACKGROUND

1. Field

One or more embodiments described herein relate to an organic light emitting display apparatus.

2. Description of the Related Art

An organic light emitting display generates images based on light from pixels that include organic light emitting diodes (OLEDs). Each OLED emits light based on a recombination of electrons and holes in an emitting layer. Displays of this type have fast response speeds and low power consumption.

Structurally, an organic light emitting display (e.g., an active matrix organic display) has control lines (e.g., gate lines, source lines, power lines) for controlling emission of light from the pixels. The control lines transmit various signals to the pixels in order to drive the pixels independently. Because the control lines are arranged adjacent to each other in a high-resolution display, the signals may interfere with each other. As a result, display quality may be degraded.

SUMMARY

In accordance with one embodiment, an organic light emitting display apparatus includes a first pixel including a first data line, a first driving thin film transistor (TFT), and a first contact metal connected to the first driving TFT and in a layer at a same level as a layer of the first data line; and a second pixel including a second data line, a second driving TFT, and a second contact metal connected to the second driving TFT and in a layer at a same level as a layer of the second data line, wherein a first gap between the first driving TFT and the first contact metal is different from a second gap between the second driving TFT and the second contact metal.

The first pixel may include a first pixel electrode on an upper layer insulated from the first data line, the second pixel may include a second pixel electrode on an upper layer insulated from the second data line, and the first pixel electrode may be different in size from the second pixel electrode.

The first pixel electrode may at least partially overlap the first data line, and the second pixel electrode may at least partially overlap the second data line. An overlapping area between the first pixel electrode and the first data line may be different from an overlapping area between the second pixel electrode and the second data line. The first pixel may be a green pixel, the second pixel may be a red pixel or a blue pixel, and the first gap may be greater than the second gap.

The areas occupied by pixel circuits in the first pixel and the second pixel may be substantially equal. The first pixel may include a storage capacitor that overlaps the first driving TFT. The driving gate electrode of the first driving TFT may be formed integrally with a first electrode of the storage capacitor. The first driving TFT may include a substrate; a driving semiconductor layer on the substrate; a first gate insulating layer on the driving semiconductor layer; and a driving gate electrode on the first gate insulating layer, wherein the driving semiconductor layer is curved.

The apparatus may include a storage capacitor on the first driving TFT, wherein the storage capacitor a first electrode, a second gate insulating layer, and a second electrode that are sequentially stacked, and wherein the first electrode is formed integrally with the driving gate electrode. The first gate insulating layer may have a thickness greater than a thickness of the second gate insulating layer.

In accordance with another embodiment, an apparatus includes a first pixel coupled to a first data line; a second pixel coupled to a second data line; a first contact metal adjacent the first data line; a second contact metal adjacent the second data line; and a driving voltage line coupled to the first and second pixels, wherein the first contact metal is spaced from the first data line by a first gap, wherein the second contact metal is spaced from the second data line by a second gap, and wherein the first gap is different from the second gap.

The driving voltage line may be coupled to driving transistors of the first and second pixels, respectively. The first pixel may include a pixel electrode of a first size, the second pixel may include a pixel electrode of a second size, and the first size may be different from the second size. The first gap may be greater than the second gap, and the first size may be less than the second size. A difference in parasitic capacitance between the first data line and the first contact metal and parasitic capacitance between the second data line and the second contact metal may be reduced as a result of the first gap being greater than the second gap and the first size being less than the second size.

The first pixel electrode may at least partially overlap the first data line, and the second pixel electrode may at least partially overlap the second data line. The first pixel electrode may overlap the first data line by a first amount, the second pixel electrode may overlap the second data line by a second amount, and the first amount may be different from the second amount. The first and second pixels may emit different colors of light. The first and second pixels may occupy substantially a same area.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
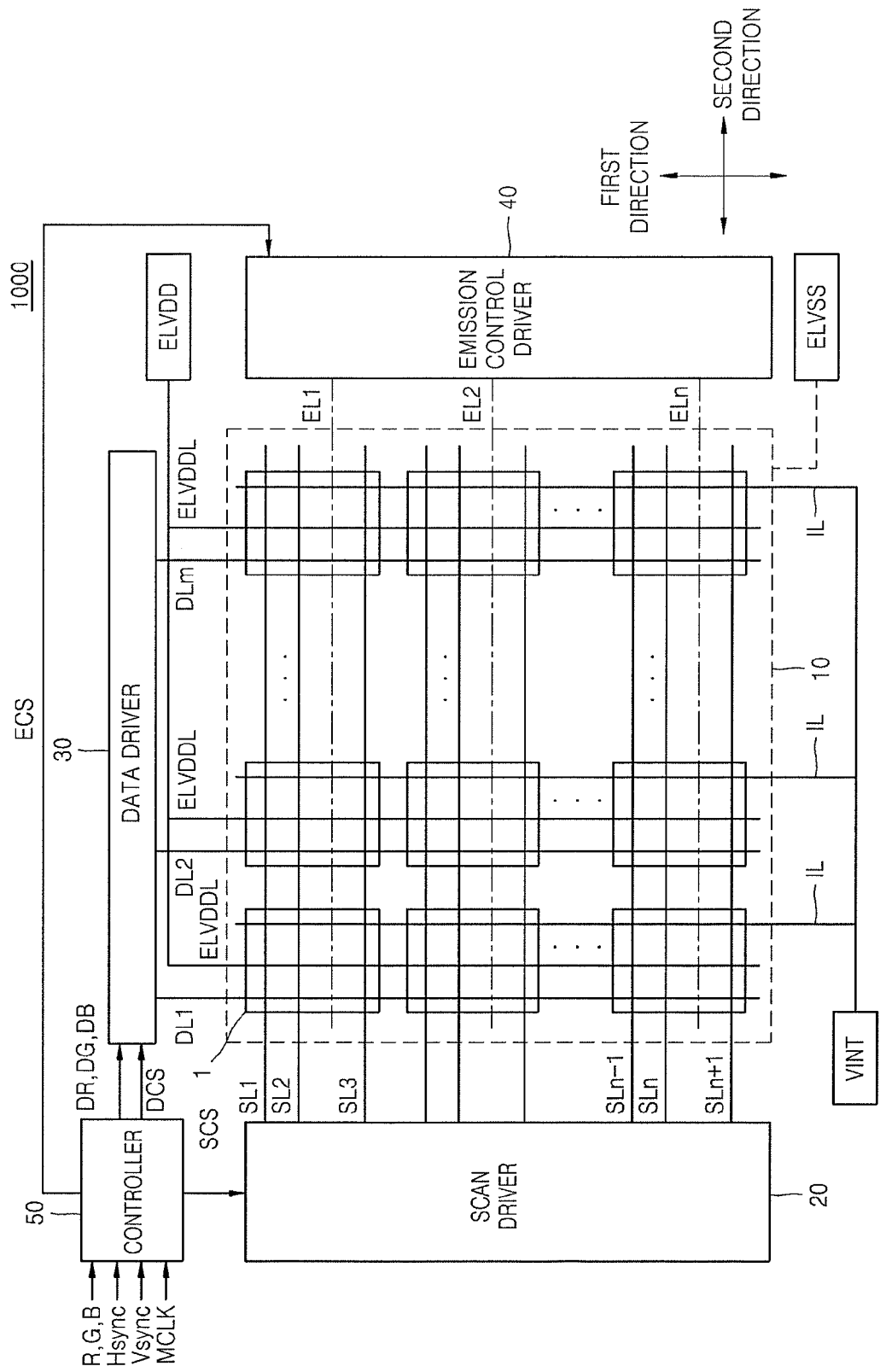
FIG. 1 illustrates an embodiment of an organic light emitting display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of an organic light emitting display apparatus 1000 which includes a display unit 10 including a plurality of pixels, a scan driving unit 20, a data driving unit 30, an emission control driving unit 40, and a controller 50.

The display unit 10 includes a plurality of pixels 1 at regions where scan lines SL1 through SLn+1, data lines DL1 through DLm, and emission control lines EL1 through ELn extend. The scan lines SL1 through SLn+1 and the emission control lines EL1 through ELn extend in a second direction (e.g., a row direction), and the data lines DL1 through DLm and a driving voltage line ELVDDL extend in a first direction (e.g., a column direction). In a pixel line, a value of n in the scan lines SL1 through SLn+1 may be different from a value of n in the emission control lines EL1 through ELn.

Each pixel 1 is connected to three scan lines from among the scan lines SL1 through SLn+1 connected to the display unit 10. The scan driving unit 20 generates and transmits three scan signals to each pixel 1 through the scan lines SL1 through SLn+1. That is, the scan driving unit 20 sequentially provides a first scan line SL2 through SLn, a second scan line SL1 through SLn−1, or a third scan line SL3 through SLn+1 with the scan signal.

An initialization voltage line IL may receive an initialization voltage of the display unit 10 from an external power supply source VINT.

Also, each pixel 1 is connected to one of the data lines DL1 through DLm connected to the display unit 10, and to one of the emission control lines EL1 through ELn connected to the display unit 10.

The data driving unit 30 transfers a data signal to each pixel 1 through the data lines DL1 through DLm. The data signal is supplied to the pixel 1 selected by the scan signal, whenever the scan signal is supplied to the first scan line SL2 through SLn+1.

The emission control driving unit 40 generates an emission control signal and transmits the emission control signal to the each pixel 1 through the emission control lines EL1 through ELn. The emission control signal controls light emission time from the pixel 1. In another embodiment, the emission control driving unit 40 may be omitted according to an internal structure of the pixel 1.

The controller 50 converts a plurality of image signals R, G, and B transmitted from an external source to a plurality of image data signals DR, DG, and DB. The image data signals DR, DG, and DB are transmitted to the data driving unit 30. Also, the controller 50 receives a vertical synchronization signal Vsync, a horizontal synchronization signal Hsync, and a clock signal MCLK to generate control signals for controlling driving of the scan driving unit 20, the data driving unit 30, and the emission control driving unit 40. The control signals are transferred to the scan driving unit 20, the data driving unit 30, and the emission control driving unit 40. That is, the controller 50 generates a scan driving control signal SCS for controlling the scan driving unit 20, a data driving control signal DCS for controlling the data driving unit 30, and an emission driving control signal ECS for controlling the emission control driving unit 40 and transfers the signals thereto.

Each of the pixels 1 receives a first power voltage EVLDD and a second power voltage ELVSS from an external source. The first power voltage ELVDD may be a predetermined high level voltage. The second power voltage ELVSS may be a voltage less than the first power voltage ELVDD or a ground voltage. The first power voltage ELVDD may be supplied to each of the pixels 1 via the driving voltage line ELVDDL.

Each of the pixels 1 emits light at a predetermined luminance based on the driving current supplied to the OLED, according to the data signal transmitted through a respective one of the data lines DL1 through DLm.

Figure 2:
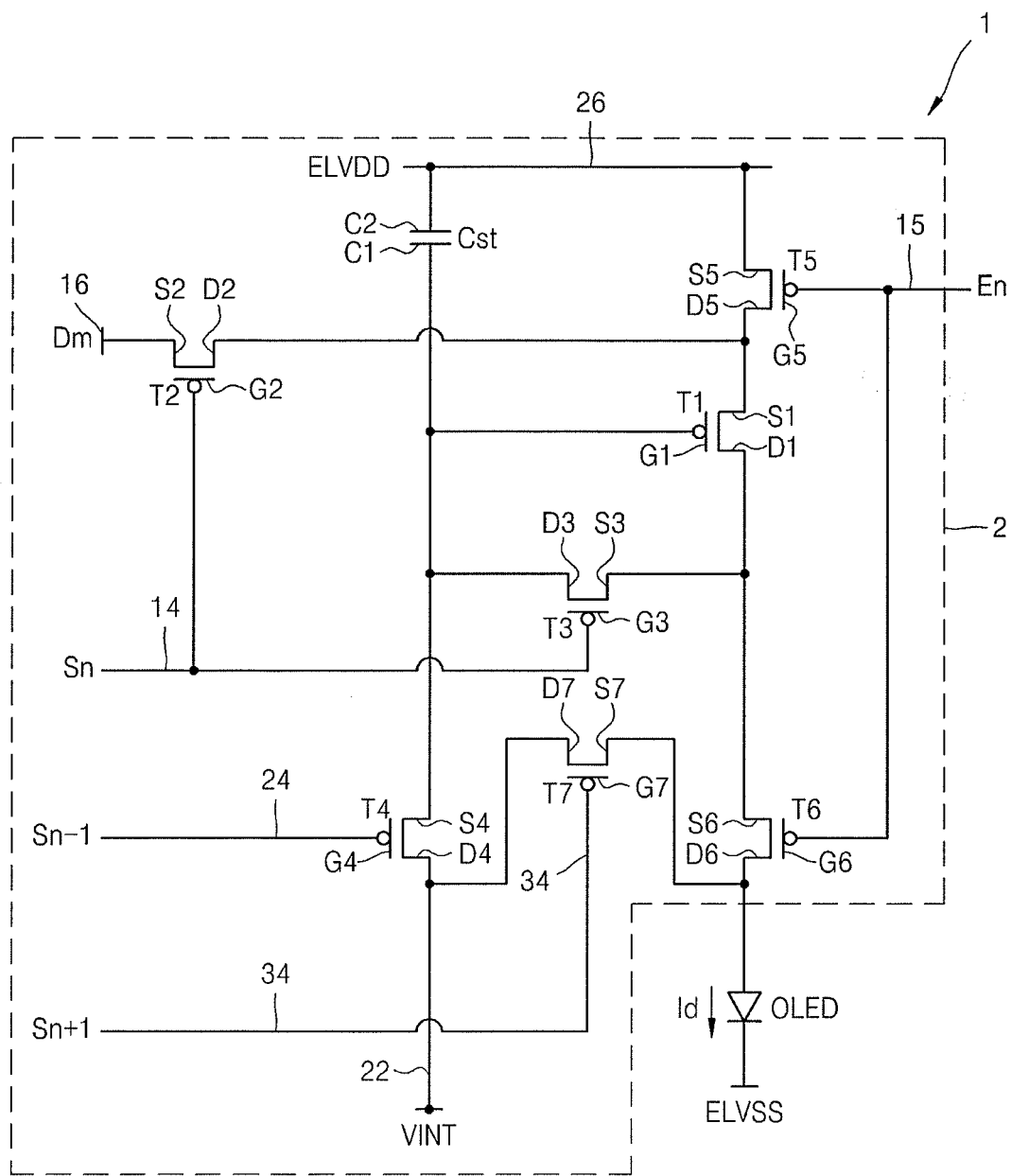
FIG. 2 illustrates an embodiment of a pixel.

FIG. 2 illustrates an embodiment of a pixel 1, which, for example, may be included in the organic light emitting display apparatus 1000. The pixel 1 includes a pixel circuit 2 having a plurality of thin film transistors (TFTs) T1 through T7 and at least one storage capacitor Cst. The pixel 1 also includes an OLED that emits light based on a driving current from the pixel circuit 2.

The TFTs T1 to T7 include a driving TFT T1, a switching TFT T2, a compensation TFT T3, a first initialization TFT T4, a first emission control TFT T5, a second emission control TFT T6, and a second initialization TFT T7.

The pixel 1 includes a first scan line 14 for transmitting a first scan signal Sn to the switching TFT T2 and the compensation TFT T3, a second scan line 24 for transmitting a second scan signal Sn−1 to the first initialization TFT T4, a third scan line 34 for transmitting a third scan signal Sn+1 to the second initialization TFT T7, an emission control line 15 for transmitting an emission control signal En to the first emission control TFT T5 and the second emission control TFT T6, a data line 16 for transmitting a data signal Dm, a driving voltage line 26 for transmitting the first power voltage ELVDD, and an initialization voltage line 22 for transmitting an initialization voltage VINT for initializing the driving TFT T1.

A driving gate electrode G1 of the driving TFT T1 is connected to a first electrode C1 of the storage capacitor Cst. A driving source electrode S1 of the driving TFT T1 is connected to the driving voltage line 26 via the first emission control TFT T5. A driving drain electrode D1 of the driving TFT T1 is electrically connected to an anode of the OLED via the second emission control TFT T6. The driving TFT T1 receives the data signal Dm according to a switching operation of the switching TFT T2 to supply a driving current Id to the OLED.

A switching gate electrode G2 of the switching TFT T2 is connected to the first scan line 14. A switching source electrode S2 of the switching TFT T2 is connected to the data line 16. A switching drain electrode D2 of the switching TFT T2 is connected to the driving source electrode S1 of the driving TFT T1. At the same time, the switching drain electrode D2 is connected to the driving voltage line 26 via the first emission control TFT T5. The switching TFT T2 is turned on by the first scan signal Sn transmitted through the first scan line 14, and then, performs a switching operation for transferring the data signal Dm transmitted through the data line 16 to the driving source electrode S1 of the driving TFT T1.

A compensation gate electrode G3 of the compensation TFT T3 is connected to the first scan line 14. A compensation source electrode S3 of the compensation TFT T3 is connected to the driving drain electrode D1 of the driving TFT T1. At the same time, the compensation source electrode S3 is connected to the anode electrode of the OLED via the second emission control TFT T6. A compensation drain electrode D3 of the compensation TFT T3 is connected to the first electrode C1 of the storage capacitor Cst, a first initialization source electrode S4 of the first initialization TFT T4, and the driving gate electrode G1 of the driving TFT T1. The compensation TFT T3 is turned on by the first scan signal Sn transmitted through the first scan line 14, and connects the driving gate electrode G1 and the driving drain electrode D1 of the driving TFT T1 to each other to make the driving TFT T1 diode-connected.

The first initialization gate electrode G4 of the first initialization TFT T4 is connected to the second scan line 24. A first initialization drain electrode D4 of the first initialization TFT T4 is connected to the initialization voltage line 22. A source electrode S4 of the first initialization TFT T4 is connected the first electrode C1 of the storage capacitor Cst, the compensation drain electrode D3 of the compensation TFT T3, and the driving gate electrode G1 of the driving TFT T1. The first initialization TFT T4 is turned on by a second scan signal Sn_1 transmitted through the second scan line 24, to transfer the initialization voltage VINT to the driving gate electrode G1 of the driving TFT T1. An initialization operation is therefore performed for initializing the voltage of the driving gate electrode G1 of the driving TFT T1.

A first emission control gate electrode G5 of the first emission control TFT T5 is connected to the emission control line 15. A first emission source electrode S5 of the first emission control TFT T5 is connected to the driving voltage line 26. A first emission drain electrode D5 of the first emission control TFT T5 is connected to the driving source electrode S1 of the driving TFT T1 and the switching drain electrode D2 of the switching TFT T2.

A second emission control gate electrode G6 of the second emission control TFT T6 is connected to the emission control line 15. A second emission source electrode S6 of the second emission control TFT T6 is connected to the driving drain electrode D1 of the driving TFT T1 and the compensation source electrode S3 of the compensation TFT T3. A second emission control drain electrode S6 of the second emission control TFT T6 is electrically connected to the anode electrode of the OLED. The first emission control TFT T5 and the second emission control TFT T6 are simultaneous turned on by the emission control signal En transmitted through the emission control line 15, so that the first power voltage ELVDD is transferred to the OLED and the driving current Id flows on the OLED.

A second initialization gate electrode G7 of the second initialization TFT T7 is connected to the third scan line 34. A second initialization source electrode S7 of the second initialization TFT T7 is connected to the anode electrode of the OLED. A second initialization drain electrode D7 of the second initialization TFT T7 is connected to the initialization voltage line 22. The second initialization TFT T7 is turned on by the third scan signal Sn+1 transmitted through the third scan line 34 to initialize the anode electrode of the OLED.

A second electrode C2 of the storage capacitor Cst is connected to the driving voltage line 26. The first electrode C1 of the storage capacitor Cst is connected to the driving gate electrode G1 of the driving TFT T1, the compensation drain electrode D3 of the compensation TFT T3, and the first initialization source electrode S4 of the first initialization TFT T4.

A cathode electrode of the OLED is connected to the second power voltage ELVSS. The OLED receives the driving current Id from the driving TFT T1 to emit light so as to display image.

Figure 3:
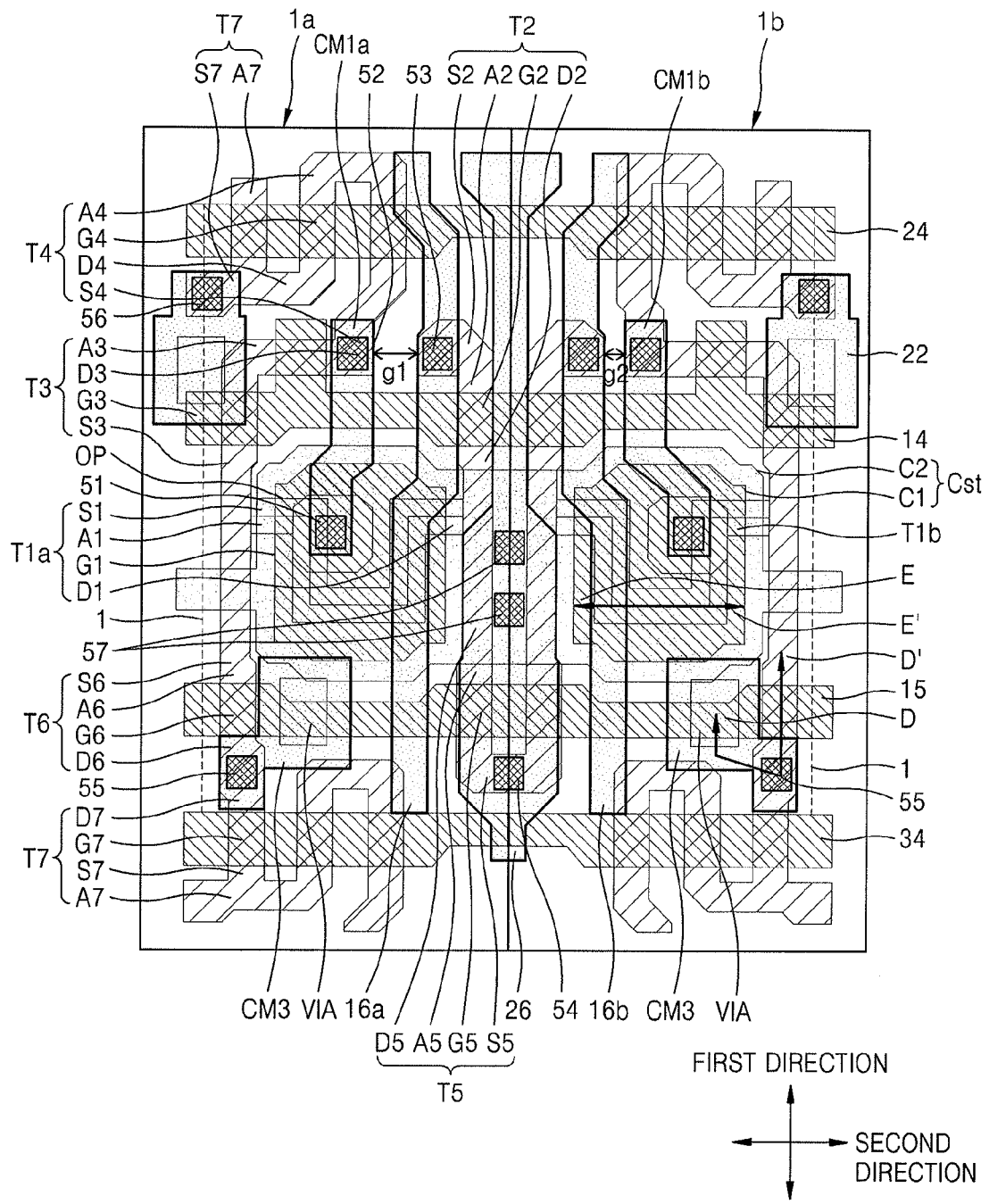
FIG. 3 illustrates an embodiment of adjacent pixels.

FIG. 3 illustrates an embodiment of two adjacent pixels, a first pixel 1a and a second pixel 1b. The first pixel 1a includes a first data line 16a, a first driving TFT T1a, and a first contact metal CM1 connected to the first driving TFT T1a and formed at the same layer as the first data line 16a. The second pixel 1b includes a second data line 16b, a second driving TFT T1b, and a second contact metal CM1b connected to the second driving TFT T1b and formed at the same layer as the second data line 16b.

A first gap g1 between the first data line 16a and the first contact metal CM1a may be different from a second gap g2 between the second data line 16b and the second contact metal CM1b. Also, each of the first pixel 1a and the second pixel 1b may include the switching TFT T2, the compensation TFT T3, the first initialization TFT T4, the first emission control TFT T5, the second emission control TFT T6, the second initialization TFT T7, the storage capacitor Cst, and the OLED.

The driving TFT T1a or T1b includes a driving semiconductor layer A1, a driving gate electrode G1, a driving source electrode S1, and a driving drain electrode D1. The driving source electrode S1 corresponds to a driving source region doped with impurities in the driving semiconductor layer A1. The driving drain electrode D1 corresponds to a driving drain region doped with impurities in the driving semiconductor layer A1. The driving gate electrode G1 is connected to the first electrode C1 of the storage capacitor Cst, the compensation drain electrode D3 of the compensation TFT T3, and the first initialization source electrode S4 of the first initialization TFT T4.

In particular, the driving gate electrode G1 is formed at the same layer as the first electrode C1 integrally with the first electrode C1. The driving gate electrode G1 is connected to the compensation drain electrode D3 and the first initialization source electrode S4 by the first contact metal CM1a or the second contact metal CM1b, via a first contact hole 51 and a second contact hole 52.

A driving channel region in each of the first and second driving TFTs T1a and T1b is curved. In FIG. 3, the channel region of the first and second driving TFTs T1a and T1b is 'U'-shaped. When forming the driving channel region that is curved, the driving channel region may be elongated within a narrow space. Because the driving channel regions of the driving TFTs T1a and T1b are formed to be long, a driving range of the gate voltage applied to the driving gate electrode G1 becomes wide. Accordingly, the gradation of light emitted from the OLED may be finely adjusted by changing the magnitude of the driving gate voltage. Thus, the resolution of images displayed in the organic light emitting display apparatus may be improved, and image display quality may be also improved. In other embodiments, the driving channel regions of the driving TFTs T1a and T1b may be curved in various shapes including but not limited to 'S' shape, 'N' shape, 'W', or an irregular shape.

The switching TFT T2 includes a switching semiconductor layer A2, a switching gate electrode G2, a switching source electrode S2, and a switching drain electrode D2. The switching source electrode S2 corresponds to a switching source region doped with impurities in the switching semiconductor layer A2. The switching drain electrode D2 corresponds to a switching drain region doped with impurities in the switching semiconductor layer A2. The switching source electrode S2 is connected to the data line 16 via a third contact hole 53. The switching drain electrode D2 is connected to the first and second driving TFTs T1a and T1b. The first emission control TFT T5. The switching gate electrode G2 is formed as a part of the first scan line 14.

The compensation TFT T3 includes a compensation semiconductor layer A3, a compensation gate electrode G3, a compensation source electrode S3, and a compensation drain electrode D3. The compensation source electrode S3 corresponds to a compensation source region doped with impurities in the compensation semiconductor layer A3. The compensation drain electrode D3 corresponds to a compensation drain region doped with impurities in the compensation semiconductor layer A3. The compensation gate electrode G3 forms a dual-gate electrode with a part of the first scan line 14 and a part of an extension line protruding from the first scan line 14 to prevent leakage current.

The first initialization TFT T4 includes a first initialization semiconductor layer A4, a first initialization gate electrode G4, a first initialization source electrode S4, and a first initialization drain electrode D4. The first initialization source electrode S4 corresponds to a first initialization source region doped with impurities in the first initialization semiconductor layer A4. The first initialization drain electrode D4 corresponds to a first initialization drain region doped with impurities in the first initialization semiconductor layer A4. The first initialization drain electrode D4 may be connected to the second initialization TFT T7.

The first initialization source electrode S4 may be connected to the driving gate electrode G1 and the first electrode C1 of the storage capacitor Cst, via the first and second contact metals CM1a and CM1b disposed in the second and first contact holes 52 and 51. The first initialization gate electrode G4 is formed as a part of the second scan line 24. The first initialization semiconductor layer G4 overlaps the first initialization gate electrode G4 twice in order to form a dual-gate electrode.

The first emission control TFT T5 includes a first emission control semiconductor layer A5, a first emission control gate electrode G5, a first emission control source electrode S5, and a first emission control drain electrode D5. The first emission control source electrode S5 corresponds to a first emission control source region doped with impurities in the first emission control semiconductor layer A5. The first emission control drain electrode D5 corresponds to a first emission control drain region doped with impurities in the first emission control semiconductor layer A5. The first emission control source electrode S5 may be connected to the driving voltage line 26 via a fourth contact hole 54. The first emission control gate electrode G5 is formed as a part of the emission control line 15.

The second emission control TFT T6 includes a second emission control semiconductor layer A6, a second emission control gate electrode G6, a second emission control source electrode S6, and a second emission control drain electrode D6. The second emission control source electrode S6 corresponds to a second emission control source region doped with impurities in the second emission control semiconductor layer A6. The second emission control drain electrode D6 corresponds to a second emission control drain region doped with impurities in the second emission control semiconductor layer A6. The second emission control drain electrode D6 is connected to the pixel electrode of the OLED, via a third contact metal CM3 connected to a fifth contact hole 55 and a via hole VIA connected to the third contact metal CM3.

The second emission control gate electrode G6 is formed as a part of the emission control line 15.

The second initialization TFT T7 includes a second initialization semiconductor layer A7, a second initialization gate electrode G7, a second initialization source electrode S7, and a second initialization drain electrode D7. The second initialization source electrode S7 corresponds to a second initialization source region doped with impurities in the second initialization semiconductor layer A7. The second initialization drain electrode D7 corresponds to a second initialization drain region doped with impurities in the second initialization semiconductor layer A7. The second initialization source electrode S7 may be connected to the initialization voltage line 22 via a sixth contact hole 56. The second initialization drain electrode D7 may be connected to the pixel electrode of the OLED via the third contact metal CM3 connected to the fifth contact hole 55, and a via hole VIA connected to the third contact metal CM3. The second initialization gate electrode G7 is formed as a part of the third scan line 34.

The first electrode C1 of the storage capacitor Cst is directly connected to the driving gate electrode G1, and is connected to the first initialization TFT T4 and the compensation TFT T3 via the first contact metal CM1a and the second contact metal CM1b disposed in the first contact hole 51 and the second contact hole 52. The first electrode C1 may be a floating electrode and is disposed to overlap the driving semiconductor layer A1.

The second electrode C2 of the storage capacitor Cst overlaps with the first electrode C1. However, the second electrode C2 may not entirely cover the first electrode C1. The second electrode C2 includes an opening op that exposes part of the first electrode C1, and the first contact hole 51 is formed in the opening op. The second electrodes C2 in two adjacent pixels 1a and 1b may be connected to each other. The driving voltage line 26 is connected to center portions of the second electrodes C2 that are included in the two adjacent pixels 1a and 1b, via a seventh contact hole 57, to transfer the driving voltage ELVDD to the two pixels 1a and 1b. That is, the two adjacent pixels 1a and 1b receive the driving voltage ELVDD from one driving voltage line 26 via the second electrodes C2 commonly formed in the two pixels 1a and 1b.

The first scan line 14, the second scan line 24, the third scan line 34, and the emission control line 15 are formed at the same level as each other and extend in a second direction. The first scan line 14, the second scan line 24, the third scan line 34, and the emission control line 15 are formed at the same level as the first electrode C1 of the storage capacitor Cst.

The first data line 16a, the second data line 16b, the driving voltage line 26, and the initialization voltage line 22 are formed at the same level as each other and extend in a first direction.

The two adjacent pixels 1a and 1b share the driving voltage line 26 with each other. In particular, the driving voltage line 26 is between the two adjacent pixels 1a and 1b and extends in the first direction. In addition, the driving voltage line 26 is connected to the first emission control TFTs T5, respectively included in the two adjacent pixels 1a and 1b, via the fourth contact hole 54. The driving voltage line 26 is connected to the second electrode C2 of the storage capacitor Cst, which is commonly included in the two adjacent pixels 1a and 1b, via the seventh contact hole 57. According to the present embodiment, since the two adjacent pixels 1a and 1b share the driving voltage line 26, the number of driving voltage line 26 may be reduced. Accordingly, it is easy to ensure a design space due to the reduction in the number of lines.

Figure 4:
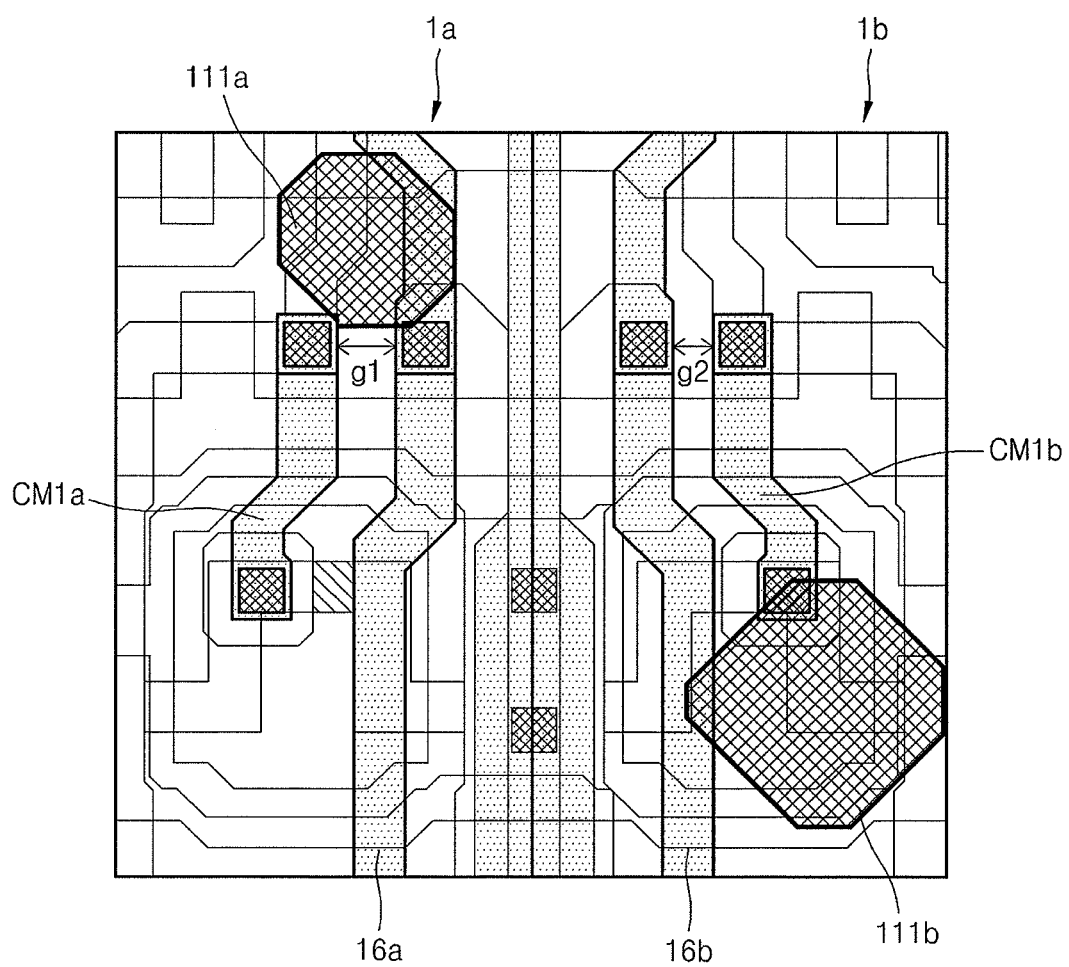
FIG. 4 illustrates a relationship between lines in adjacent pixels and a pixel electrode according to one embodiment.

FIG. 4 illustrates an example of a relationship between lines of the two adjacent pixels 1*a* and 1 *b* and pixel electrodes 111*a* and 111*b*. The first pixel 1*a* includes the first data line 16*a*, the first driving TFT T1*a*, and the first contact metal CM1*a* connected to the first driving TFT T1*a* and formed at the same level as the first data line 16*a*. The second pixel 1*b* includes the second data line 16*b*, the second driving TFT T1*b*, and the second contact metal CM1*b* connected to the second driving TFT T1*b* and formed at the same level as the second data line 16*b*.

The first gap g1 between the first data line 16*a* and the first contact metal CM1*a* may be different from the second gap g2 between the second data line 16*b* and the second contact metal CM1*b*.

In the pixel of the organic light emitting display apparatus, various lines and various TFTs may be arranged in a restricted space for obtaining high performance and high integration. Accordingly, distances between the lines are reduced. Thus, a parasitic capacitance may occur between the lines. The parasitic capacitance may cause interferences between the signals.

Also, a value of the parasitic capacitance may vary depending on each pixel. For example, a value of the parasitic capacitance between the first contact metal CM1*a* and the first data line 16*a* of the first pixel 1*a*, and a value of the parasitic capacitance existing between the second contact metal CM1*b* and the second data line 16*b* of the second pixel 1*b*, may be different from each other. Then, the interference in each pixel may be generated differently from the other pixels. Thus, the brightness of light emitted from the pixels may vary.

The aforementioned phenomenon may be generated because the first pixel electrode 111*a* disposed in the first pixel 1*a* and the second pixel electrode 111*b* disposed in the second pixel 1*b* may have different sizes. Otherwise, an area in which the first pixel electrode 111*a* and the first data line 16*a* overlap each other, and an area in which the second pixel electrode 111*b* and the second data line 16*b* overlap each other, may be different. Otherwise, the light emitted from the first pixel 1*a* and the light emitted from the second pixel 1*b* may have different colors.

In order to reduce the differences between parasitic capacitances in the pixels, distances between the contact metal and the data line connected to the driving TFT T1 in the pixels may be differentiated.

The first pixel electrode 111*a* may be disposed in an upper layer higher than the layer in which the first data line 16*a* and the first contact metal CM1*a* are arranged. The first pixel electrode 111*a* is insulated from the first data line 16*a*. For example, a planarization layer PL (see FIG. 5) is between the first pixel electrode 111*a* and the first data line 16*a* so as to insulate the first pixel electrode 111*a* and the first data line 16*a* from each other. The first pixel electrode 111*a* may at least partially overlap the first data line 16*a*. The overlapping area may affect the parasitic capacitance between the first data line 16*a* and the first contact metal CM1*a*.

The second pixel electrode 111*b* may be located in an upper layer of the layer in which the data line 16*b* and the second contact metal CM1*b* are disposed. The second data line 111*b* is insulated from the second data line 16*b*. For example, a planarization layer PL (see FIG. 5) may be disposed between the second pixel electrode 111*b* and the second data line 16*b*, so as to insulate the second pixel electrode 111*b* and the second data line 16*b* from each other.

The second pixel electrode 111*b* may at least partially overlap the second data line 16*b*. The overlapping area may affect the parasitic capacitance between the second data line 16*b* and the second contact metal CM1*b*.

In one or more embodiments, the first pixel electrode 111*a* and the second pixel electrode 111*b* may have different sizes. Accordingly, the first gap g1 between the first contact metal CM1*a* and the first data line 16*a*, and the second gap g2 between the second contact metal CM1*b* and the second data line 16*b*, may be adjusted. For example, if the first pixel electrode 111*a* has a greater size than that of the second pixel electrode 111*b*, the first gap g1 may be set to be greater than the second gap g2.

In some embodiments, an overlapping area between the first pixel electrode 111*a* and the first data line 16*a* may be different from an overlapping area between the second pixel electrode 111*b* and the second data line 16*b*. For example, if the overlapping area between the first pixel electrode 111*a* and the first data line 16*a* is greater than the overlapping area between the second pixel electrode 111*b* and the second data line 16*b*, the first gap g1 may be greater than the second gap g2.

In some embodiments, the first pixel 1*a* may be a green pixel and the second pixel 1*b* may be a red or blue pixel. In this case, the first gap g1 may be greater than the second gap g2. The color of light emitted from the first pixel 1*a* and the second pixel 1*b* may vary depending on a kind of an intermediate layer on the first pixel electrode 111*a* and the second pixel electrode 111*b*. A light emission region may be formed based on the first and second pixel electrodes 111*a* and 111 *b*.

In the one or more embodiments, the pixel circuits 2 (see FIG. 2) in the first pixel 1*a* and the second pixel 1*b* may be substantially equal. For example, the gap between the contact metal and the data line connected to the driving TFT may be only adjusted within the same area. Accordingly, the gap between the lines in the pixel is only adjusted to adjust the value of parasitic capacitance, while the area occupied by the pixel circuit 2 is equal to those of other pixels.

Figure 5:
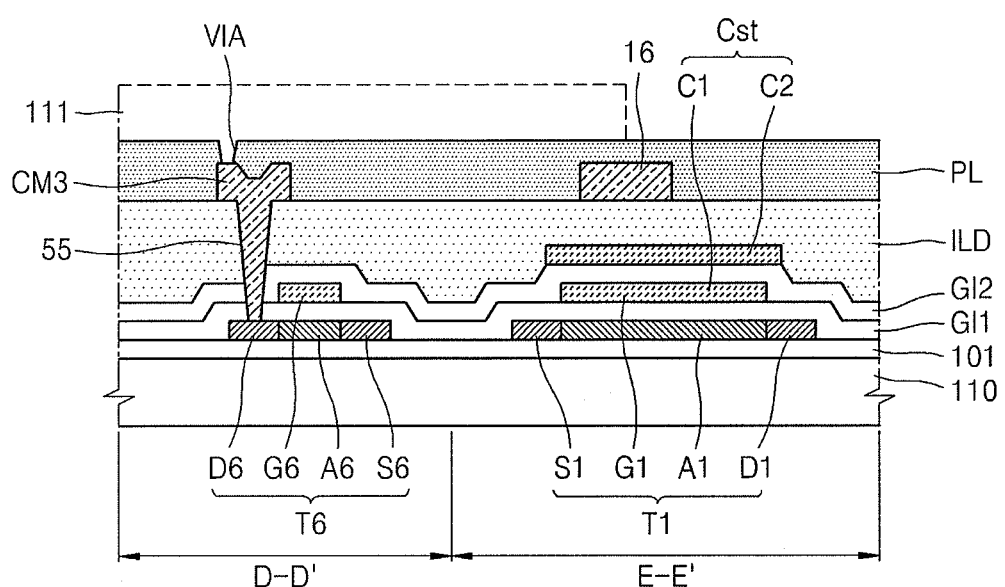
FIG. 5 illustrates the adjacent pixels along section lines D-D' and E-E' in FIG. 3.

FIG. 5 illustrates an embodiment of pixels taken along lines D-D' and E-E' in FIG. 3. In FIG. 5, the driving TFT T1, the second emission control TFT T6, and the storage capacitor Cst are shown from among the plurality of TFTs.

In FIG. 5, order to clarify certain features, components that are less related to the driving TFT T1, the second emission control TFT T6, and the storage capacitor Cst are omitted from among components arranged in the cross-section such as lines, electrodes, and semiconductor layers. Therefore, the cross-sectional view of FIG. 5 may be different from an actual cross-section taken along lines D-D' and E-E'. In FIG. 5, the second driving TFT T1 is denoted as a driving TFT T1, the second data line 16*b* is denoted as the data line 16, and the second pixel electrode 111*b* is denoted as a pixel electrode 111.

Referring to FIG. 5, a buffer layer 101 is formed on a substrate 110. The buffer layer 101 may serve as a barrier layer and/or a blocking layer that prevents impurity ions from being dispersed, prevents moisture or external air from infiltrating into the substrate 110, and planarizes a surface of the substrate 110.

The driving semiconductor layer A1 of the driving TFT T1 and the second emission control semiconductor layer A6 of the second emission control TFT T6 are formed on the buffer layer 101. The semiconductor layers A1 and A6 are formed of polysilicon, and each include a channel region on which impurities are not doped, and a source region and a drain region formed at opposite sides of the channel region and doped with impurities. The impurities may vary depending on a kind of the TFT, e.g., N-type or P-type impurities.

Although not shown in FIG. 5, the switching semiconductor layer A2 of the switching TFT T2, the compensation semiconductor layer A3 of the compensation TFT T3, the first initialization semiconductor layer A4 of the first initialization TFT T4, the second initialization semiconductor layer A7 of the second initialization TFT T7, and the first emission control semiconductor layer A5 of the first emission control TFT T5 may be simultaneously formed with the driving semiconductor layer A1 and the second emission control semiconductor layer A6 to be connected thereto.

A first gate insulating layer GI1 is stacked on an entire surface of the substrate 110 to cover the semiconductor layers A1 and A6. The first gate insulating layer GI1 may have a single-layered or multi-layered structure including an inorganic material such as silicon oxide or silicon nitride. The first gate insulating layer GI1 insulates the semiconductor layers from the gate electrodes.

According to the present embodiment, the first gate insulating layer GI1 has a thickness greater than a second gate insulating layer GI2. The first gate insulating layer GI1 insulates the semiconductor layers from the gate electrodes G1 through G7 in the driving TFT T1, the switching TFT T2, the compensation TFT T3, the first initialization TFT T4, the second initialization TFT T7, the first emission control TFT T5, and the second emission control TFT T6.

If the first gate insulating layer GI1 is thick, the parasitic capacitance between the semiconductor layers and the gate electrodes G1 through G7 may be reduced and smudges in the images displayed by the organic light emitting display apparatus may be reduced. In addition, in a case of the driving TFT T1, the parasitic capacitance between the driving semiconductor layer A1 and the driving gate electrode G1 is reduced, and a driving range of a gate voltage Vgs applied to the driving gate electrode G1 may be increased. Accordingly, light emitted from the OLED may be controlled to have greater gradation by varying the magnitude of the gate voltage Vgs applied to the driving gate electrode G1 of the driving TFT T1.

The second emission control gate electrode G6 of the second emission control TFT T6, the driving gate electrode G1 of the driving TFT T1, and the first electrode C1 of the storage capacitor Cst are formed on the first gate insulating layer GI1. In addition, although not shown in FIG. 5, the switching gate electrode G2 of the switching TFT T2, the compensation gate electrode G3 of the compensation TFT T3, the first initialization gate electrode G4 of the first initialization TFT T4, the second initialization gate electrode G7 of the second initialization TFT T7, and the first emission control gate electrode G5 of the first emission control TFT T5 are formed simultaneously with the second emission control gate electrode G6 and the driving gate electrode G1.

The switching gate electrode G2, the compensation gate electrode G3, the first initialization gate electrode G4, the second initialization gate electrode G7, the first emission control gate electrode G5, and the second emission control gate electrode G6 are defined by the first scan line 14, the second scan line 24, the third scan line 34, and the emission control line 15 that overlap the semiconductor layers.

Therefore, the process of forming the switching gate electrode G2, the compensation gate electrode G3, the first initialization gate electrode G4, the second initialization gate electrode G7, the first emission control gate electrode G5, and the second emission control gate electrode G6 corresponds to a process of forming the first scan line 14, the second scan line 24, the third scan line 34, and the emission control line 15. The driving gate electrode G1 is formed integrally with the first electrode C1. The gate electrodes G1 through G7 may be formed of one or more metal materials selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenium (Mo), titanium (Ti), tungsten (W), and copper (Cu).

According to the present embodiment, the storage capacitor Cst overlaps the driving TFT T1. In particular, because the driving gate electrode G1 and the first electrode C1 are formed integrally with each other, the storage capacitor Cst and the driving TFT T1 inevitably overlap each other. Because the storage capacitor Cst overlaps with the driving TFT T1, a storage capacity of the storage capacitor Cst may be sufficiently ensured.

The second gate insulating layer GI2 is formed on the entire surface of the substrate 110 so as to cover the gate electrodes G1 through G7. The second gate insulating layer GI2 may have a single-layered or multi-layered structure including an inorganic material such as silicon oxide or silicon nitride. The second gate insulating layer GI2 performs as a dielectric layer of the storage capacitor Cst. In order to increase the storage capacity of the storage capacitor Cst, the second gate insulating layer GI2 may have a thickness less than that of the first gate insulating layer GI1.

The second electrode C2 of the storage capacitor Cst is formed on the second gate electrode GI2. The second electrode C2 overlaps the first electrode C1. The second electrode C2 includes an opening op exposing a part of the first electrode C1. The first electrode C1 may be connected to the compensation TFT T3 and the first initialization TFT T4 via the first contact hole 51 formed in the opening op. The second electrode C2 may be formed of one or more metal materials including Al, Pt, Pd, Ag, Mg, Au, Ni, Nd, Ir, Cr, Li, Ca, Mo, Ti, W, or Cu.

An interlayer dielectric layer ILD is formed on the entire surface of the substrate 110 so as to cover the second electrode C2 of the storage capacitor Cst. The interlayer dielectric layer ILD may have a multi-layered structure including an organic insulating material, an inorganic insulating material, or the organic insulating material and the inorganic insulating material that are alternately stacked. For example, the inorganic material may be metal oxide or metal nitride. In particular, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$). The interlayer dielectric layer ILD may insulate the storage capacitor Cst and the data line 16 from each other.

The data line 16 and third contact metal CM3 are disposed on the interlayer dielectric layer. Although not shown in FIG. 5, the first contact metal CM1a and the second contact metal CM1b may be disposed on the interlayer dielectric layer ILD. The data line 16, the first contact metal CM1a, the second contact metal CM1b, and the third contact metal CM3 may include one or more metal materials such as Al, Pt, Pd, Ag, Mg, Au, Ni, Nd, Ir, Cr, Li, Ca, Mo, Ti, W, or Cu.

A planarization layer PL is disposed on the entire surface of the substrate 110 in order to cover the first contact metal CM1a, the second contact metal CM1b, and the third contact metal CM3. The pixel electrode 111 is formed on the planarization layer PL. The pixel electrode PL is connected to the third contact metal CM3, via the via hole VIA, to be connected to the second emission control drain electrode D6 and the second initialization source electrode S7. The pixel electrode 111 may at least partially overlap the data line 16.

In addition, the pixel electrode 111 of the OLED is shown in FIG. 5, whereas FIG. 3 does not show the pixel electrode 111. The OLED includes the pixel electrode 111 and an opposite electrode facing the pixel electrode 111. An intermediate layer including an organic emission layer is between the pixel electrode 111 and the opposite electrode.

The intermediate layer may be formed of a low molecular organic material or a high molecular organic material. If the low molecular organic material is used, the intermediate layer includes the organic emission layer, and may further include at least one of a hole injection layer (HIL), a hole transport layer (HTL), an electron transport layer (ETL), or an electron injection layer (EIL).

In another embodiment, the intermediate layer may include other various functional layers in addition to the organic emission layer. The low molecular organic material may form the intermediate layer in a vacuum deposition method. If the intermediate layer is formed of the high molecular organic material, the intermediate layer may only include an HTL toward the pixel electrode 111 based on the organic emission layer. The HTL may be formed on the upper portion of the pixel electrode 111 by an inkjet printing method or a spin coating method.

From among the source electrodes and the drain electrodes of the TFTs in FIGS. 3 and 5, the source and drain electrodes not connected to other lines may be formed at the same layer as the semiconductor layers. For example, the source and drain electrodes of the TFT may be selectively formed of polysilicon doped with a dopant. In another embodiment, the source electrode and the drain electrode of the TFT may be formed in different layers from the semiconductor layer, and may be connected to the source and drain regions of the semiconductor layer via the contact hole.

According to the one or more of the aforementioned embodiments, the value of parasitic capacitance that may vary according to pixels may be reduced by differentiating the gap between the contact metal and the data line connected to the driving TFT T1 in each pixel. Accordingly, a difference between interference in the pixels may be reduced.

By way of summation and review, an organic light emitting display has control lines for controlling emission of light from the pixels. Because the control lines are arranged adjacent to each other in a high-resolution display, the signals may interfere with each other. As a result, display quality may be degraded. In accordance with one or more embodiments, cross-talk in an organic light emitting display apparatus is reduced by differentiating intervals between lines in each of pixels. The cross-talk may be attributable to parasitic capacitance. By adjusting, or suppressing, parasitic capacitance among pixels, display quality may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light emitting display apparatus, comprising:
    a first pixel including a first data line, a first driving thin film transistor (TFT) including a first gate electrode, a first contact metal connected to the first gate electrode and in a layer at a same level as a layer of the first data line, and a first pixel electrode on an upper layer insulated from the first data line; and
    a second pixel including a second data line, a second driving TFT including a second gate electrode, a second contact metal connected to the second gate electrode and in a layer at a same level as a layer of the second data line, and a second pixel electrode on an upper layer insulated from the second data line, wherein an overlapping area between the first pixel electrode and the first data line is greater than an overlapping area between the second pixel electrode and the second data line, and wherein a first gap between the first data line and the first contact metal is greater than a second gap between the second data line and the second contact metal.

2. The apparatus as claimed in claim 1, wherein:
    the first pixel electrode is different in size from the second pixel electrode.

3. The apparatus as claimed in claim 1, wherein:
    the first pixel is a green pixel,
    the second pixel is a red pixel or a blue pixel.

4. The apparatus as claimed in claim 1, wherein areas occupied by pixel circuits in the first pixel and the second pixel are substantially equal.

5. The apparatus as claimed in claim 1, wherein the first pixel includes a storage capacitor that overlaps the first driving TFT.

6. The apparatus as claimed in claim 5, wherein a driving gate electrode of the first driving TFT is formed integrally with a first electrode of the storage capacitor.

7. The apparatus as claimed in claim 1, wherein the first driving TFT includes:
    a substrate;
    a driving semiconductor layer on the substrate;
    a first gate insulating layer on the driving semiconductor layer; and
    a driving gate electrode on the first gate insulating layer, wherein the driving semiconductor layer is curved.

8. The apparatus as claimed in claim 7, further comprising:
    a storage capacitor on the first driving TFT,
    wherein the storage capacitor a first electrode, a second gate insulating layer, and a second electrode that are sequentially stacked, and wherein the first electrode is formed integrally with the driving gate electrode.

9. The apparatus as claimed in claim 8, wherein the first gate insulating layer has a thickness greater than a thickness of the second gate insulating layer.

10. An apparatus, comprising:
    a first pixel coupled to a first data line and a first scan line;
    a second pixel coupled to a second data line and a second scan line;
    a first contact metal adjacent the first data line;
    a second contact metal adjacent the second data line; and
    a driving voltage line, wherein the first contact metal is spaced from the first data line by a first gap, wherein the second contact metal is spaced from the second data line by a second gap, wherein the first gap is different from the second gap, wherein the first and second gaps extend in a direction of the first and second scan lines, and wherein the first pixel includes a first pixel electrode of a first size on an upper layer insulated from the first data line, the second pixel includes a second pixel electrode of a second size on an upper layer insulated from the second data line, an overlapping area between the first pixel electrode and the first data line is greater than an overlapping area between the second pixel electrode and the second data line, and the first gap is greater than the second gap.

11. The apparatus as claimed in claim 10, wherein the driving voltage line is coupled to driving transistors of the first and second pixels, respectively.

12. The apparatus as claimed in claim 10, wherein:
the first size is less than the second size.

13. The apparatus as claimed in claim 12, wherein a difference in parasitic capacitance between the first data line and the first contact metal and parasitic capacitance between the second data line and the second contact metal is reduced as a result of the first gap being greater than the second gap and the first size being less than the second size.

14. The apparatus as claimed in 10, wherein the first and second pixels emit different colors of light.

15. The apparatus as claimed in claim 10, wherein the first and second pixels occupy substantially a same area.

* * * * *